United States Patent
Kohda (10) Patent No.: US 9,722,167 B2
(45) Date of Patent: Aug. 1, 2017

(54) PIEZOELECTRIC VIBRATION PIECE AND PIEZOELECTRIC VIBRATION DEVICE USING SAME

(71) Applicant: DAISHINKU CORPORATION, Hyogo (JP)

(72) Inventor: Naoki Kohda, Hyogo (JP)

(73) Assignee: Daishinku Corporation, Hyogo (JP)

( * ) Notice: Subject to any disclaimer, the term of this patent is extended or adjusted under 35 U.S.C. 154(b) by 389 days.

(21) Appl. No.: 14/410,377

(22) PCT Filed: Jul. 1, 2013

(86) PCT No.: PCT/JP2013/004064
§ 371 (c)(1),
(2) Date: Dec. 22, 2014

(87) PCT Pub. No.: WO2014/006868
PCT Pub. Date: Jan. 9, 2014

(65) Prior Publication Data
US 2015/0325776 A1  Nov. 12, 2015

(30) Foreign Application Priority Data
Jul. 6, 2012 (JP) ................. 2012-152602

(51) Int. Cl.
*H01L 41/04* (2006.01)
*H01L 41/047* (2006.01)
(Continued)

(52) U.S. Cl.
CPC ...... *H01L 41/0475* (2013.01); *H01L 41/0477* (2013.01); *H03H 9/02015* (2013.01);
(Continued)

(58) Field of Classification Search
CPC ............ H01L 41/0475; H01L 41/0477; H03H 9/02015; H03H 9/1014; H03H 9/177; H03H 9/19
See application file for complete search history.

(56) References Cited

U.S. PATENT DOCUMENTS

2013/0043959 A1*  2/2013  Ishii ..................... H03H 9/0542
                                                         331/158
2013/0043960 A1*  2/2013  Ishii ..................... H03H 9/0542
                                                         331/158

FOREIGN PATENT DOCUMENTS

JP          7-254837        10/1995
JP          2003-152496      5/2003
(Continued)

*Primary Examiner* — J. San Martin
(74) *Attorney, Agent, or Firm* — Norris McLaughlin & Marcus, P.A.

(57) ABSTRACT

A piezoelectric vibration piece has an inverted mesa-type structure, comprising a thinned portion serving as a vibration region at a central part of a piezoelectric plate; and a thickened portion formed all along or partly along perimeter of the thinned portion to reinforce the thinned portion. In the piezoelectric vibration piece, contact metals including a large number of discrete metallic thin films are provided on the whole surfaces of the piezoelectric plate. A piezoelectric vibration device comprises the piezoelectric vibration piece which is housed in a package, wherein extraction electrodes of the piezoelectric vibration piece are connected to internal terminals of the package through a conductive adhesive. These structural and technical advantages prevent undesirable flowage of the conductive adhesive before thermal curing. As a result, the piezoelectric vibration piece and the piezoelectric vibration device comprising the same successfully attain excellent vibration characteristics.

11 Claims, 11 Drawing Sheets

(51) Int. Cl.
*H03H 9/02* (2006.01)
*H03H 9/17* (2006.01)
*H03H 9/19* (2006.01)
*H03H 9/10* (2006.01)

(52) U.S. Cl.
CPC .......... *H03H 9/1014* (2013.01); *H03H 9/177* (2013.01); *H03H 9/19* (2013.01)

(56) References Cited

FOREIGN PATENT DOCUMENTS

| | | |
|---|---|---|
| JP | 4241483 | 1/2009 |
| JP | 2011-082870 | 4/2011 |
| WO | WO-2007/023685 | 3/2007 |

* cited by examiner

RELATED ART

FIG. 18

PIEZOELECTRIC VIBRATION PIECE AND PIEZOELECTRIC VIBRATION DEVICE USING SAME

BACKGROUND OF THE INVENTION

The invention relates to inverted mesa-type piezoelectric vibration pieces, and piezoelectric vibration devices using the same.

With increasingly higher frequencies in, for example, frequencies in communication devices and operating frequencies in microcomputers, it is necessary for piezoelectric vibration devices, such as crystal vibrators, crystal filters, and crystal resonators, to likewise meet the demand for higher frequencies. The piezoelectric plates configured for higher frequencies, which are typically used, are AT-cut crystal plates featured by thickness slip vibration, and the frequencies of such are, as is all too well known, decided by the thicknesses of crystal plates. Since the frequencies and thicknesses are in inverse proportion, the crystal plates are desirably ultrathin in thickness. To process the crystal plates in extremely small thicknesses needs a complicated grinding work, resulting in poor yields in the production of piezoelectric vibration pieces.

To deal with this problem, the patent document 1 discloses a piezoelectric vibration device with a generally called inverted mesa-type piezoelectric vibration piece.

In such an inverted mesa-type piezoelectric vibration device structurally advantageous in that driving electrodes and extraction electrodes are formed on surfaces of a thinned portion of a piezoelectric plate provided in the piezoelectric vibration piece, a vibration region can be significantly reduced in thickness, which enables the piezoelectric vibration device to attain higher frequencies.

Figure 17:
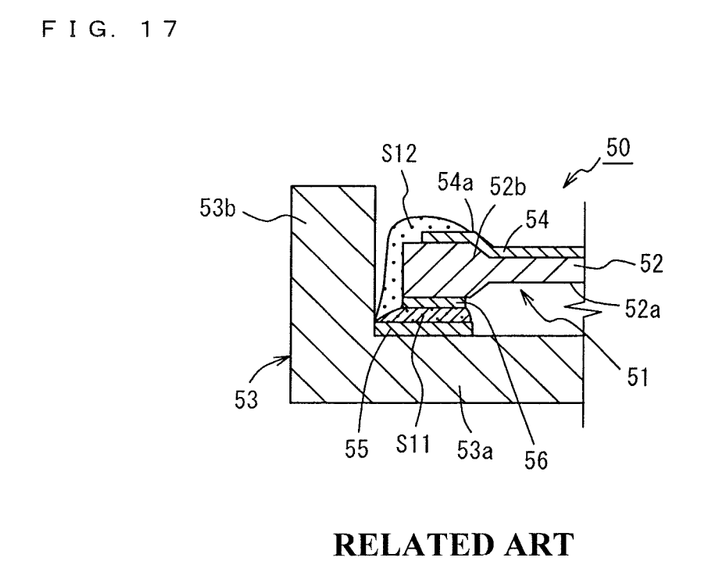
FIG. 17 is a sectional view of a primary portion of a conventional piezoelectric vibration piece.

FIG. 17 is a sectional view of a primary portion of the inverted mesa-type piezoelectric vibration device.

A piezoelectric vibration device 50 illustrated in the drawing has a piezoelectric vibration piece 51. The piezoelectric vibration piece 51 has an inverted mesa-type piezoelectric plate (crystal plate) 52 made of crystal. The piezoelectric plate 52 is provided with a thinned portion (vibration region) 52a rectangular in planar view at its central part, and a thickened portion 52b formed around the thinned portion 52a to reinforce the vibration region.

On the upper and lower surfaces of the thinned portion 52a of the piezoelectric plate 52 are arranged driving electrodes, which are respectively extracted by extraction electrodes to end parts on the upper surface of the thickened portion 52. Of these extraction electrodes, the drawing illustrates an extraction electrode 54 formed on the upper surfaces of the thinned portion 52 and the thickened portion 52b, and an end part 54a thereof.

A package 53 is in the form of a shallow box with an open upper surface constructed of a bottom portion 53a rectangular in planar shape and a peripheral wall portion 53b formed around the bottom portion 53a.

The package 53 for housing the piezoelectric vibration piece 51 has, on its bottom part 53a, an internal terminal 55 in electrical continuity with an external terminal not illustrated in the drawing. The lid of the package 53 is not illustrated in the drawing.

The internal terminal 55 is pre-coated with a conductive adhesive s11. A connection electrode 56 on the lower surface of the thickened portion 52b is electrically and mechanically connected through the conductive adhesive s11 to the internal terminal 56.

An end part 54a of the extraction electrode 54 on the piezoelectric plate 52 is electrically and mechanically connected through a conductive adhesive s12 to the internal terminal 55.

The conductive adhesives s11 and s12 are adhesives in pasty form having flow properties, which are obtained by, for example, mixing a silicon-based adhesive with a solvent medium and a metallic filler such as silver. These adhesives are applied to their targets by a coating tool such as a dispenser or any other suitable tool.

The conductive adhesives s11 and s12 are thermally cured when heated to temperatures equal to or higher than a predetermined temperature. By thermally curing these adhesives, the end part 54a of the extraction electrode 54 is fixedly connected electrically and mechanically to the internal terminal 55.

The thermal curing is performed in, for example, a heating furnace. The piezoelectric vibration device 50, after the conductive adhesives s11 and s12 are applied thereto on the outside of the heating furnace, is put in the heating furnace to thermally cure the adhesives.

JP 4241483 B1 is related art.

SUMMARY OF THE INVENTION

These days, piezoelectric vibration devices are increasingly microminiaturized. In the piezoelectric vibration device 50 illustrated in FIG. 17, therefore, points at which the conductive adhesives s11 and s12 are to be applied are approaching to a lower limit in diameter.

Reducing an area coated with the conductive adhesives s11 and s12 to the lower limit in diameter or below may jeopardize desirable adhesiveness between the conductive adhesives s11 and s12 and the electrodes, and deteriorates mechanical reliability against any impacts during handling of the piezoelectric vibration device 50, for example, when the piezoelectric vibration device 50 is accidentally dropped.

Figure 18:
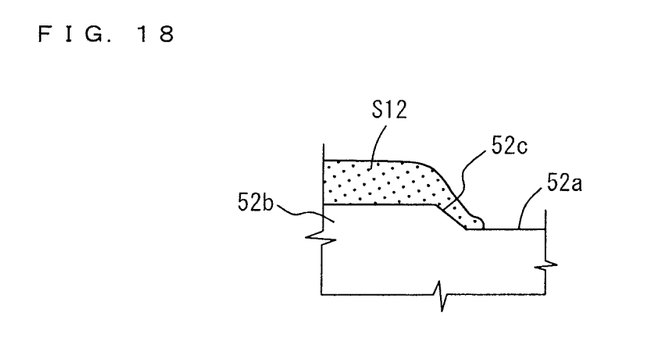
FIG. 18 is an enlarged view of vicinity of a thickness portion in the piezoelectric vibration piece of FIG. 17, illustrating the fluid state of a conductive adhesive before thermal curing.

For these reasons, the coating area of the conductive adhesive s12 in the end part 54a of the extraction electrode 54 is relatively small, considering the loading of the conductive adhesive s12. Due to the fact, the flowable and pasty conductive adhesive s12 is likely to spread out, running down on an inclined side wall surface 52c of the thickened portion 52b or may even partly spread far enough to reach the upper surface of the thinned portion 52a as illustrated in FIG. 18 by the time when the conductive adhesive s12 is thermally cured in the piezoelectric vibration device put in the heating furnace.

The conductive adhesive s12, if thermally cured in the heating furnace with its part already arriving at the upper surface of the thinned portion 52a, may adversely affect the vibration of the thinned portion 52a. This leads to poor vibration characteristics of the piezoelectric vibration piece 51, compromising the vibration performance of the piezoelectric vibration device 50.

The invention was accomplished to solve the conventional problems described so far, and has an object to provide a piezoelectric vibration piece superior in vibration characteristics and a piezoelectric vibration device using the same by preventing outflow of such a conductive adhesive still pasty before thermal curing.

A piezoelectric vibration piece according to the invention comprises: a piezoelectric plate having a thinned portion serving as a vibration region at its central part and a thickened portion formed all along or partly along perimeter of the thinned portion to reinforce the thinned portion; driving electrodes formed on upper and lower surfaces of the thinned portion of the piezoelectric plate; and extraction electrodes for externally extracting the driving electrodes, wherein the thickened portion has a first inclined side wall surface facing the thinned portion, and a contact metal including a large number of discrete metallic thin films is formed on at least the first inclined side wall surface.

According to the invention wherein the contact metal including a large number of discrete metallic thin films is provided on at least the first inclined side wall surface of the thickened portion, the first inclined side wall surface has a large number of projections and depressions formed thereon by these discrete metallic thin films.

Using a conductive adhesive to provide connection between internal terminals and end parts of the extraction electrodes on the upper surface of the thickened portion possibly involves the risk that the conductive adhesive may spread out, running down on the inclined side wall surface. According to the invention, however, surface tension acted upon the conductive adhesive by the multiple projections and depressions effectively prevents that the conductive adhesive runs down on the inclined side wall surface, flowing onto the thinned portion.

Preferably, the thickened portion is partly formed in an electrode-extracting region substantially equal in thickness to the thinned portion, end parts of the extraction electrodes are extracted to the electrode-extracting region, the thickened portion has, in its part, at least two opposing second inclined side wall surfaces facing the electrode-extracting region, and the contact metal is provided on not less than one of the at least two opposing second inclined side wall surfaces.

According to the invention wherein the contact metal including a large number of fine projections and depressions is provided on the second inclined side wall surfaces of the thickened portion facing the electrode-extracting region, the second inclined side wall surfaces of the thickened portion have a large number of fine projections and depressions formed thereon by the discrete metallic thin films.

Applying a conductive adhesive to the electrode-extracting region possibly involves the risk that the conductive adhesive may run down on the inclined side wall surface. According to the invention, however, surface tension acted upon the conductive adhesive by the multiple fine projections and depressions effectively prevents that the conductive adhesive flows out of the electrode-extracting region onto the thinned portion.

Preferably, the contact metal is provided on the at least two opposing second inclined side wall surfaces of the thickened portion on both sides of the electrode-extracting region.

Preferably, the contact metal is further provided in the electrode-extracting region. By providing the contact metal in the electrode-extracting region as well, it is even more effectively prevented that the conductive adhesive flows out onto the thinned portion.

Preferably, the contact metal is made of a metal selected from Cr, Ru, Mo, and W, and the contact metal includes a large number of discrete metallic thin films formed in a thickness between 10 Å and 30 Å (Angstrom).

Preferably, the contact metal is provided on whole upper and lower surfaces of the piezoelectric plate, and the electrodes are provided on the contact metals.

Preferably, the thickened portion is provided on one of or both of the upper and lower surfaces of the thinned portion of the piezoelectric plate.

Preferably, the driving electrodes include a common electrode provided on one of the surfaces of the piezoelectric plate, and at least a pair of divided electrodes provided correspondingly to the common electrode on another one of the surfaces of the piezoelectric plate.

Preferably, the thinned portion is rectangular in planer view, serving as a vibration region, the thickened portion is formed along perimeter of the thinned portion and having at least a pair of corner sections diagonally opposite to each other, end parts of a pair of extraction electrodes for extracting the common electrode are formed at the at least a pair of corner sections of the thickened portion, recesses are formed at the at least a pair of corner sections, the contact metal is provided in the recesses, and end parts of the pair of extraction electrodes are respectively provided on the contact metals.

Preferably an AT-cut crystal plate constitutes the piezoelectric plate.

The piezoelectric vibration device according to the invention at least comprises the piezoelectric vibration piece according to the invention, and a package in the form of a shallow box with an open upper surface, the package having internal terminals formed in its inner bottom part. The piezoelectric vibration piece is housed in the package, and the extraction electrodes of the piezoelectric vibration piece are connected to the internal terminals through a conductive adhesive.

According to the piezoelectric vibration piece of the invention, when a conductive adhesive in pasty form before thermal curing is applied to the extraction electrodes, surface tension is acted upon the conductive adhesive by the fine projections and depressions formed by the metallic thin films of the contact metal. This advantageously prevents that the conductive adhesive still thermally uncured is headed from the inclined side wall surface of the thickened portion toward the thinned portion.

The piezoelectric vibration device according to the invention is structurally advantageous in that the piezoelectric vibration piece according to the invention is housed in the package, and the extraction electrodes are connected to the internal terminals of the package through a conductive adhesive, thereby attaining a desired piezoelectric performance.

DETAILED DESCRIPTION OF THE INVENTION

An inverted mesa-type piezoelectric vibration piece and a piezoelectric vibration device with the piezoelectric vibration piece according to an embodiment of the invention are hereinafter described in detail referring to the accompanying drawings.

Figure 1:
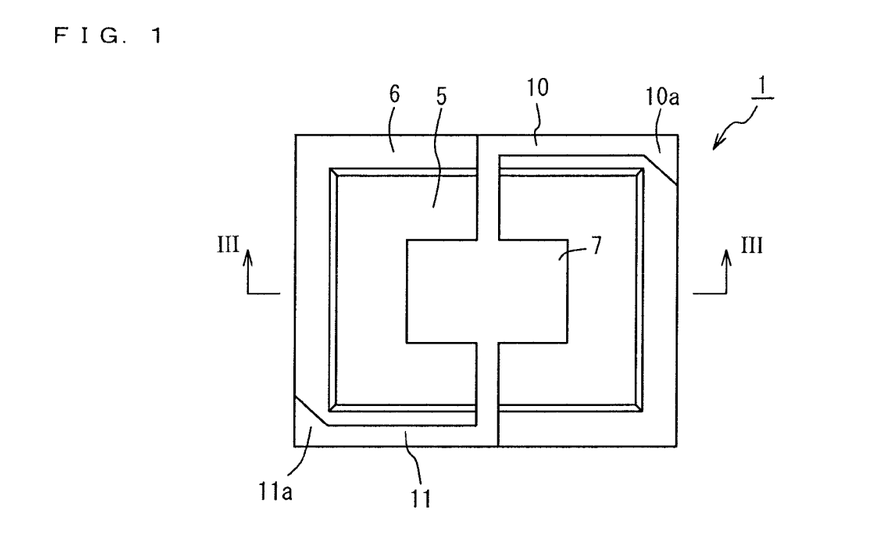
FIG. 1 is an upper view of a piezoelectric vibration piece according to an embodiment of the invention.
Figure 2:
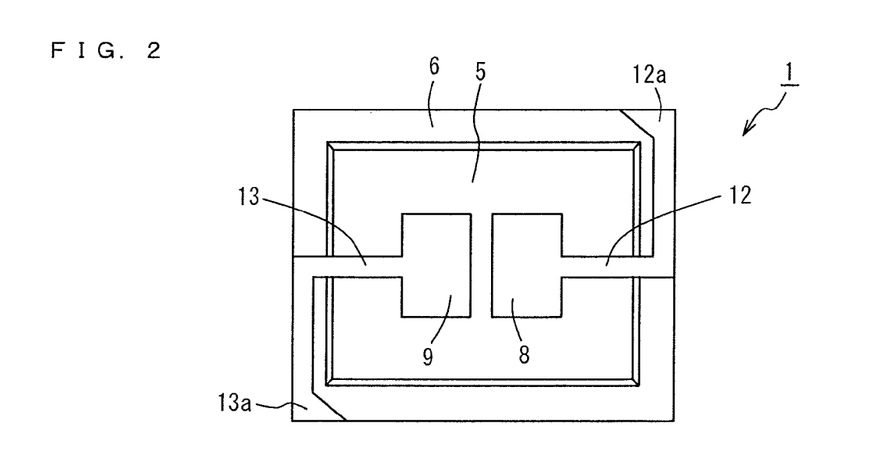
FIG. 2 is a lower view of the piezoelectric vibration piece illustrated in FIG. 1.
Figure 3:
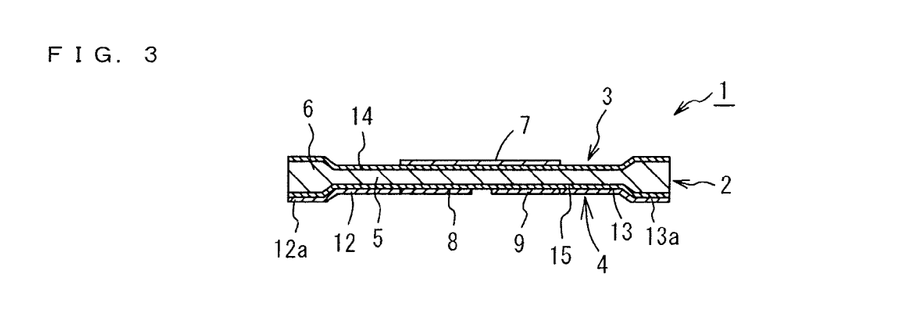
FIG. 3 is a sectional view of the illustration of FIG. 1 cut along III-III line.
Figure 4:
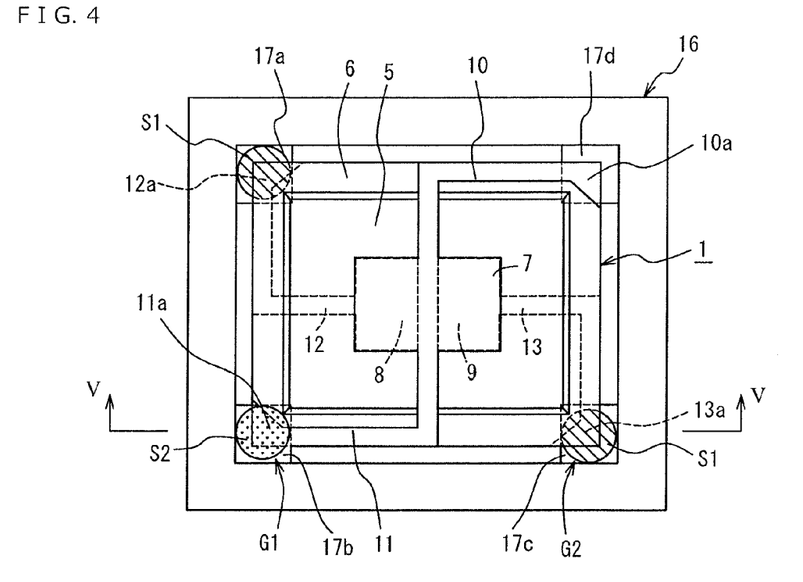
FIG. 4 is an upper view of a piezoelectric vibration device with a lid having been removed therefrom, comprising the piezoelectric vibration piece illustrated in FIG. 1.
Figure 5:
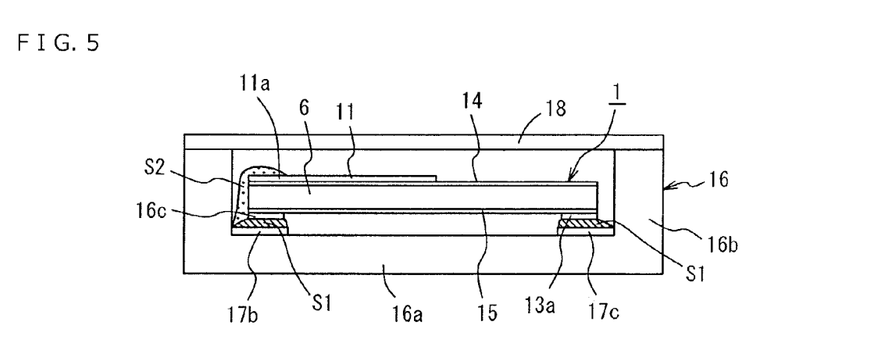
FIG. 5 is a sectional view of the illustration of FIG. 4 cut along V-V line.

The piezoelectric vibration piece and the piezoelectric vibration device are described referring to FIGS. 1 to 5. FIG. 1 is an upper view of the piezoelectric vibration piece. FIG. 2 is a lower view of the piezoelectric vibration piece. FIG. 3 is a sectional view of the illustration of FIG. 1 cut along III-III line. FIG. 4 is an upper view of the piezoelectric vibration device with a lid having been removed therefrom. FIG. 5 is a sectional view of the illustration of FIG. 4 cut along V-V line.

Referring to FIGS. 1 to 3, a reference numeral 1 denotes a piezoelectric vibration piece. The piezoelectric vibration piece 1 has a piezoelectric plate 2. An example of the piezoelectric plate 2 is an AT-cut crystal plate rectangular in planer view.

The piezoelectric plate 2 has recesses 3 and 4 which are formed in substantially central regions on its upper and lower surfaces. The recesses 3 and 4 are formed by a conventional processing technique such as wet etching, dry etching, or sand blasting. The piezoelectric vibration piece 1 with the recesses 3 and 4 thus formed therein has a generally called inverted mesa-type structure constructed of a thinned portion 5 (vibration region) rectangular in planar view, and a thickened portion 6 formed along perimeter of the thinned portion 5 to reinforce the thinned portion 5 serving as the vibration region.

A common electrode 7 rectangular in planar view is formed in a substantially central region on the upper surface of the thinned portion 5. In a substantially central region on the lower surface of the thinned portion 2 are formed a pair of divided electrodes 8 and 9 correspondingly to the common electrode 7. The divided electrodes 8 and 9 are similarly rectangular in planar view and facing each other.

As illustrated in FIG. 1, the common electrode 7 is externally extracted by extraction electrodes 10 and 11. The extraction electrodes 10 and 11 respectively have an end part 10a and an end part 11a, and these end parts 10a and 11a are extracted to diagonally opposite two corner sections on the upper surface of the thickened portion 6.

As illustrated in FIG. 2, the divided electrodes 8 and 9 are externally extracted by extraction electrodes 12 and 13. The extraction electrodes 12 and 13 respectively have an end part 12a and an end part 13a, and these end parts 12a and 13a are extracted to diagonally opposite two corner sections, which are different to the before-mentioned two corner sections, on the lower surface of the thickened portion 6.

As illustrated in FIG. 3, contact metals 14 and 15 are formed by vacuum evaporation on the whole upper and lower surfaces of the piezoelectric plate 2 in thicknesses between 10 Å and 30 Å. The contact metals 14 and 15 are made of chromium superior in adhesion to the piezoelectric plate 2, and the electrodes 7 to 13 are formed on the contact metals 14 and 15. The contact metals 14 and 15 formed in the before-mentioned thickness provide a large number of discrete metallic thin films. The contact metals 14 and 15 are not illustrated in FIGS. 1 and 2.

In the drawings used later for illustrative purposes, the multiple discrete metallic thin films are illustrated in particulate form to make it visually noticeable that a large number of projections and depressions are thereby formed on the piezoelectric plate 2.

As to the thicknesses of the contact metals 14 and 15, thicknesses smaller than 10 Å may undermine surface tension, which will be described later, to be acted upon a conductive adhesive. On the other hand, thicknesses of the contact metals 14 and 15 larger than 30 Å may result in poor vibration characteristics in the thinned portion 5. A preferable range of thicknesses is between 15 Å and 30 Å, and even a better range of thicknesses is between 12 Å and 18 Å.

The contact metals 14 and 15 are not necessarily made of chromium. The material of the contact metals 14 and 15 is optionally one selected from, for example, ruthenium, molybdenum, and tungsten, and alloys thereof.

The contact metals 14 and 15 made of any material but chromium, as with the case of using chromium, are formed by vacuum evaporation in thicknesses between 10 Å and 30 Å, or preferably between 12 Å and 18 Å. The contact metals 14 and 15 made of any material but chromium formed in any of these thicknesses, as with the case of using chromium, provide a large number of discrete metallic thin films.

The contact metals 14 and 15 formed in such thicknesses, though their material has electrical conductivity, provide the metallic thin films electrically insulated from one another. This obviates a possible risk that the electrodes 7 to 13, after they are formed on the contact metals 14 and 15 by evaporation, cause electrical short circuit in the contact metals 14 and 15 located outside the regions where the electrodes 7 to 13 are formed.

The piezoelectric vibration piece 1 according to the embodiment is structurally and technically characterized as described so far.

The piezoelectric vibration piece 1 is produced by the production steps described below. A plurality of rectangular regions are formed on an AT-cut crystal wafer not illustrated in the drawings, and the thinned portion 5 and the thickened portion 6 constituting the piezoelectric vibration piece 1 are formed in each of these rectangular regions. The rectangular regions thus structured are defined as an inverted-mesa structure. Then, the contact metals 14 and 15 are formed by, for example, evaporation on all over the both surfaces of the wafer, and the electrodes 8 to 13 are formed in each of the rectangular regions. Finally, the rectangular regions are divided by dicing into separate pieces, each of which is a piezoelectric plate 2. As a result of these production steps, the piezoelectric vibration piece 1 is obtained.

As illustrated in FIGS. 4 and 5, the piezoelectric vibration piece 1 is housed in a package 16 made of a ceramic material such as aluminum. FIG. 4 is an upper view of a piezoelectric vibration device with a lid having been removed therefrom, comprising the piezoelectric vibration piece illustrated in FIG. 1. FIG. 5 is a sectional view of the illustration of FIG. 4 cut along V-V line.

The package 16 is in the form of a shallow box with an open upper surface constructed of a bottom portion 16a rectangular in planar view and a peripheral wall portion 16b formed in a standing manner around the bottom portion 16a. The package 16 constitutes a housing portion for the piezoelectric plate 2. At four corner sections of the bottom portion 16a of the package 16 are provided internal terminals 17a to 17d.

The upper surfaces of the internal terminals 17a and 17c are pre-coated with a conductive adhesive s1. In the drawings are not illustrated external terminals in electrical continuity with the internal terminals 17a to 17d.

The end part 11a of the extraction electrode 11 associated with the common electrode 7 is connected through a conductive adhesive s2 to the conductive adhesive s1, internal terminal 17b, and connection electrode 16c.

The end part 13a of the extraction electrode 13 associated with the divided electrode 9 is connected through the conductive adhesive s1 to the internal terminal 17c. Similarly, the end part 12a of the extraction electrode 12 associated with the divided electrode 8 is connected through the conductive adhesive s1 to the internal terminal 17a.

The conductive adhesives a1 and s2 are applied to their targets by the use of, for example, a dispenser and thermally cured in a heating furnace in a subsequent step.

When the open upper surface of the package 16, after the piezoelectric vibration piece 1 is mounted therein, is hermetically sealed with a lid 18 by seam welding or with a metallic brazing material, the production of the piezoelectric vibration device according to the embodiment is completed.

The piezoelectric vibration device has a surface mount structure in which the internal terminals 17a to 17d of the package 16 are connected to the external terminals, not illustrated in the drawing, provided on the bottom outer surface of the of the package 16.

Figure 6:
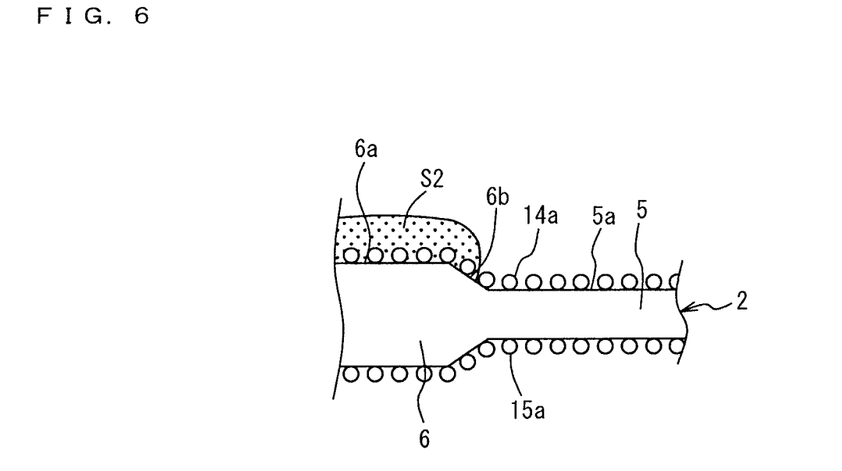
FIG. 6 is an enlarged view of a section pointed by arrow G1 and its vicinity in FIG. 4, illustrating the fluid state of a conductive adhesive on an upper-surface side before thermal curing.
Figure 7:
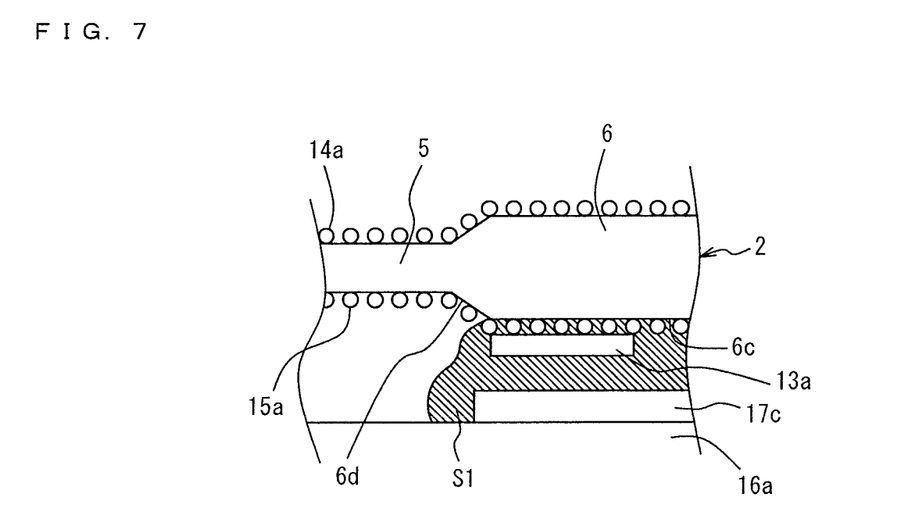
FIG. 7 is an enlarged view of a section pointed by arrow G2 and its vicinity in FIG. 4, illustrating the fluid state of a conductive adhesive on a lower-surface side before thermal curing.

Referring to FIGS. 6 and 7, functions of the contact metals 14 and 15 are described. Neither of the contact metals 14 and 15 per se has electrical insulation properties. The contact metals 14 and 15 provided in thicknesses between 10 Å and 30 Å are consequently in the form of a large number of discrete metallic thin films 14a and 15a in a microscopic view.

FIG. 6 is an enlarged view of a section pointed by arrow G1 and its vicinity in FIG. 4, illustrating the fluid state of the conductive adhesive s2 on the upper-surface side of the thickened portion 6 before thermal curing. FIG. 7 is an enlarged view of a section pointed by arrow G2 and its vicinity in FIG. 4, illustrating the fluid state of the conductive adhesive s1 on the lower-surface side of the thickened portion 6 before thermal curing.

Referring to FIG. 6, when the contact metal 14 on the upper-surface side of the piezoelectric plate 2 are formed of chromium by vacuum evaporation in a thickness between 10 Å and 30 Å, a large number of metallic thin films 14a physically isolated from one another are accordingly formed. On the whole, these metallic thin films 14a constitute a large number of fine projections and depressions on the piezoelectric plate 2, which are formed on an upper surface 6a and an inclined side wall surface 6b of the thickened portion 6, and an upper surface 5a of the thinned portion 5.

As illustrated in FIG. 5, when the conductive adhesive s2 is applied to connect the end part 11a of the extraction electrode 11 associated with the common electrode 7 to the conductive adhesive s1, internal terminal 17b, and connection electrode 16c, the conductive adhesive s2 hardly stays on the end part 11a alone but further spreads out of the end part 11a to the upper surface 6a and the inclined side wall surface 6b of the thickened portion 6. Then, the conductive adhesive s2 spread on the inclined side wall surface 6b, which is still flowable before thermal curing, may gravitationally start to run down on the inclined side wall surface 6b.

By virtue of surface tension acted upon the conductive adhesive s2 by the projections and depressions provided by the discrete metallic thin films 14a formed on the inclined side wall surface 6b, however, it is prevented that the conductive adhesive s2 runs down on the inclined side wall surface 6b.

The conductive adhesive s2 thus retained midway on the inclined side wall surface 6b of the thickened portion 6 does not further advance or arrive at the upper surface 5a of the thinned portion 5.

It is not particularly necessary to form the contact metals 14 and 15 on all over the upper and lower surfaces of the piezoelectric plate 2 in order to prevent such flowage of the conductive adhesive s2. The contact metals 14 and 15 may be formed on the inclined side wall surface of the thickened portion 6 facing the thinned portion 5 alone.

Referring to FIG. 7, the conductive adhesive s1 applied to the upper surface of the internal terminal 17c on the bottom portion 16a of the package 16, under pressure between the internal terminal 17c and the end part 13a of the extraction electrode 13 on the lower surface 6c of the thickened portion 6, may partly spread out onto the bottom portion 16a of the package 16 or an inclined side wall surface 6d of the thickened portion 6.

However, surface tension acted upon the conductive adhesive s1 by the projections and depressions provided by the multiple discrete metallic thin films 15a prevents the conductive adhesive s1 from spreading out, interfering with further flowage of the conductive adhesive s1 onto the surface of the thinned portion 5.

Advantageously, during the transfer of the piezoelectric vibration device to the step of thermally curing the conductive adhesives s1 and s2, these adhesives are retained midway on the inclined side wall surfaces 6b and 6d not to further advance onto the surface of the thinned portion 5.

Therefore, the thermally-cured piezoelectric vibration device can maintain a desired vibration performance.

Referring to FIGS. 8 to 12, an inverted mesa-type piezoelectric vibration piece and a piezoelectric vibration device with the piezoelectric vibration device according to another embodiment of the invention are hereinafter described in detail. The piezoelectric vibration device has a piezoelectric vibration piece 1A. The piezoelectric vibration piece 1A is structurally different to the piezoelectric vibration piece 1 described earlier in that partial regions of the thickened portion 6 are substantially equal in thickness to the thinned portion 5, constituting electrode-extracting regions 20 to 23. According to this structure, the extraction electrodes 10 to 13 can be extracted from the thinned portion 5 to the electrode-extracting regions 20 to 23, throughout which there is no difference in height. This obviates the occurrence of connection failure in the extraction electrodes 10 to 13 due to height differences.

Figure 8:
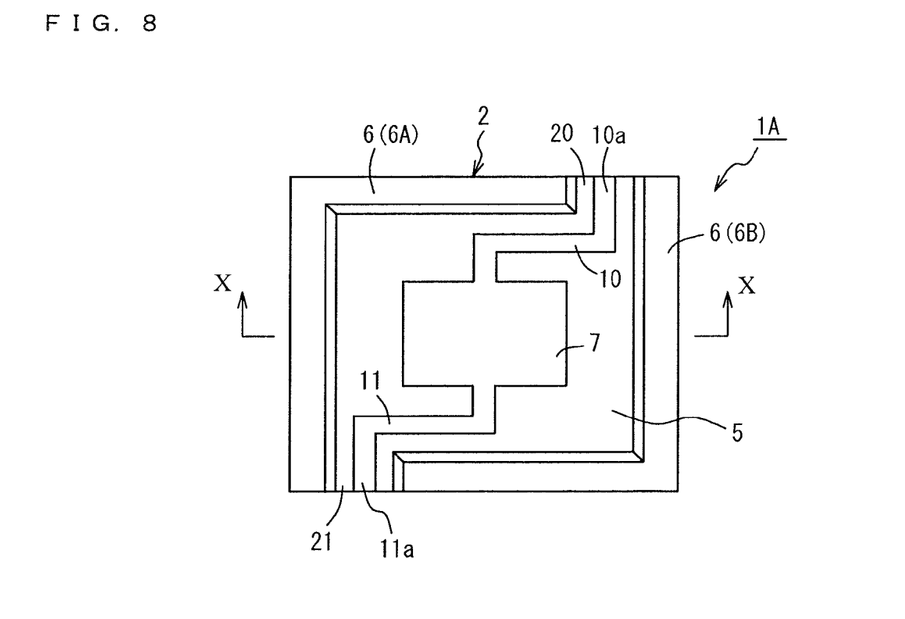
FIG. 8 is an upper view of a piezoelectric vibration piece according to another embodiment of the invention.
Figure 9:
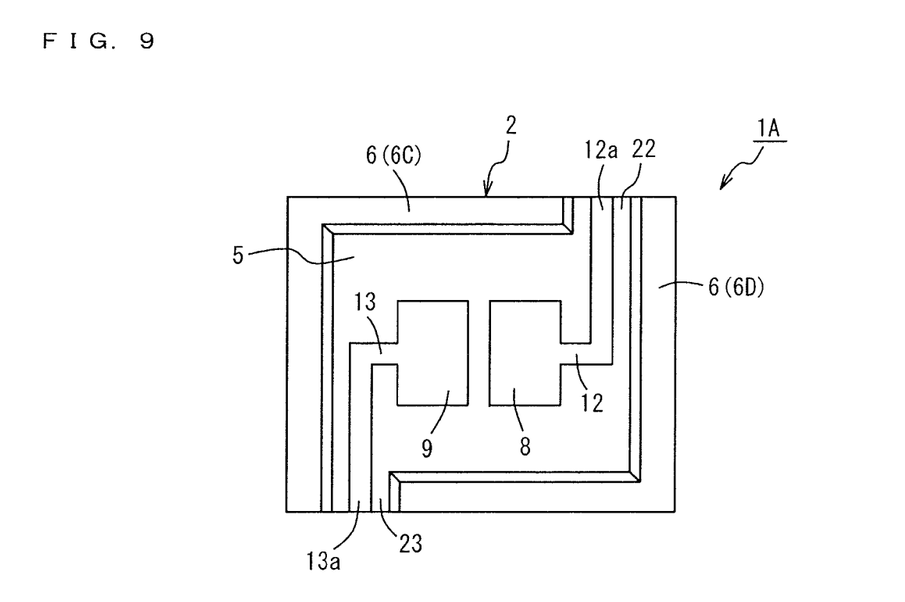
FIG. 9 is a lower view of the piezoelectric vibration piece illustrated in FIG. 8.
Figure 10:
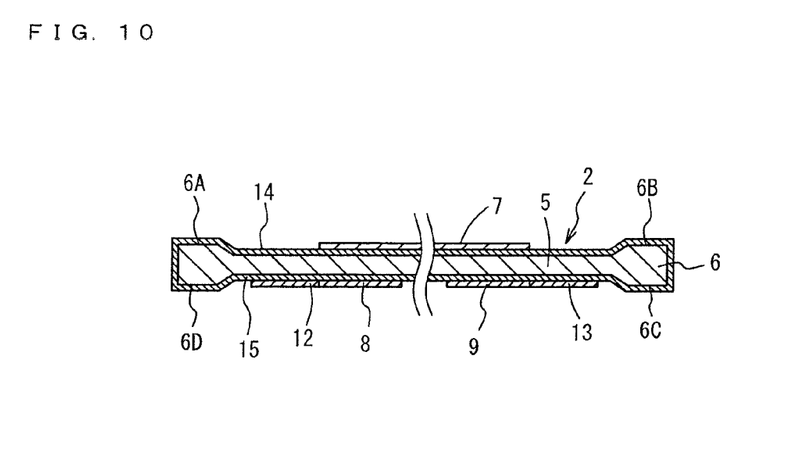
FIG. 10 is a sectional view of the illustration of FIG. 8 cut along X-X line.
Figure 11:
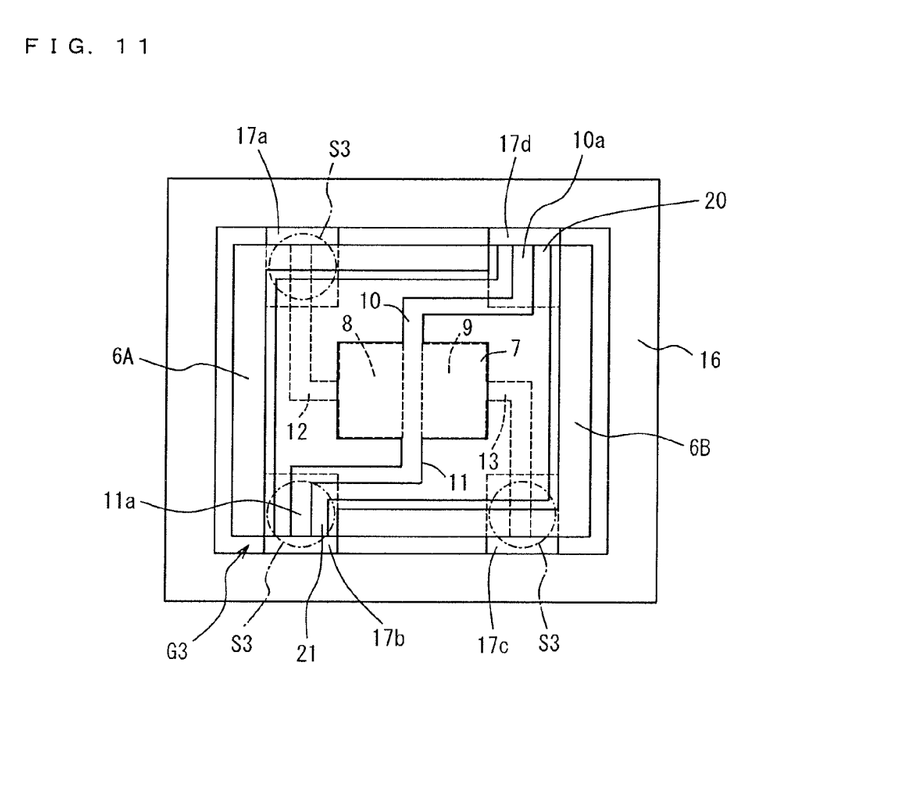
FIG. 11 is an upper view of a piezoelectric vibration device with a lid having been removed therefrom, comprising the piezoelectric vibration piece illustrated in FIG. 8.
Figure 12A:
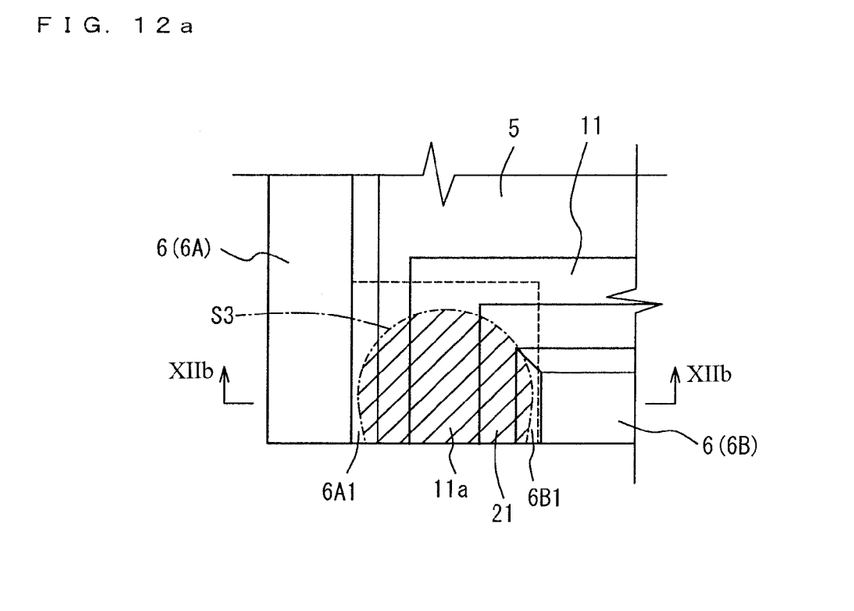
FIG. 12a is an enlarged plan view of a section pointed by arrow G3 and its vicinity in FIG. 11.
Figure 12B:
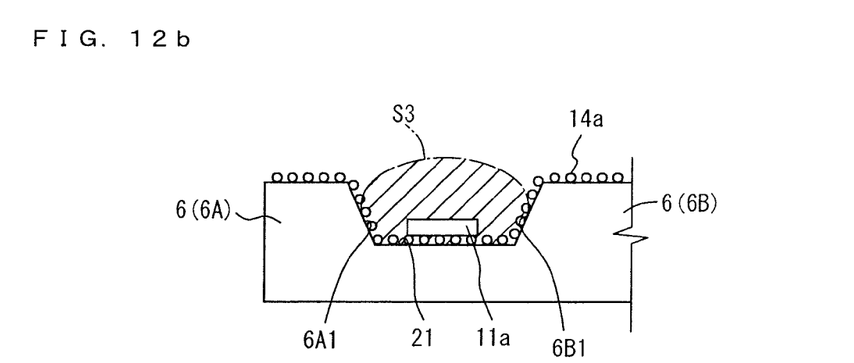
FIG. 12b is a sectional view of the illustration of FIG. 12a cut along XIIb-XIIb line.

FIG. 8 is an upper view of the piezoelectric vibration piece 1A. FIG. 9 is a lower view of the piezoelectric vibration piece 1A. FIG. 10 is an enlarged sectional view of the illustration of FIG. 8 cut along X-X line. FIG. 11 is an upper view of the piezoelectric vibration device with a lid having removed therefrom, comprising the piezoelectric vibration piece 1A. FIG. 12a is an enlarged upper view of a section pointed by arrow G3 and its vicinity in FIG. 11. FIG. 12b is a sectional view of the illustration of FIG. 12a cut along XIIb-XIIb line. In these drawings, any structural elements corresponding to those of FIGS. 1 to 5 are simply illustrated with the same reference symbols, detailed description of which is omitted.

Similarly to the piezoelectric vibration piece 1, the piezoelectric vibration piece 1A has an inverted mesa-type structure constructed of a thinned portion 5 and a thickened portion 6 respectively formed on front and back surfaces of a piezoelectric plate 2. As is the case with the embodiment described earlier, an AT-cut crystal plate rectangular in planar view, for example, constitutes the piezoelectric plate 2.

A common electrode 7 is formed on the upper surface of the thinned portion 5, and divided electrodes 8 and 9 are formed on the lower surface of the thinned portion 5. The common electrode 7 is externally extracted by extraction electrodes 10 and 11, and the divided electrodes 8 and 9 are externally extracted by extraction electrodes 12 and 13.

In the thickened portion 6 on the upper surface of the piezoelectric plate 2, partial regions diagonally opposite to each other, except corner sections thereof, are equal in thickness to the thinned portion 5, constituting electrode-extracting regions 20 and 21. On the upper-surface side of the piezoelectric plate 2, the thickened portion 6 is divided into two thickened regions 6A and 6B with the electrode-extracting regions 20 and 21 interposed therebetween.

In the thickened portion 6 on the lower surface of the piezoelectric plate 2, partial regions diagonally opposite to each other, except corner sections thereof, are substantially equal in thickness to the thinned portion 5, constituting electrode-extracting regions 22 and 23. On the lower-surface side of the piezoelectric plate 2, the thickened portion 6 is similarly divided into two thickened regions 6C and 6D.

The electrode-extracting regions 20 and 21 are not formed at the corner sections of the piezoelectric plate 2 but are interposed between inclined side wall surfaces on both sides of the thickened portions 6A and 6B. The electrode-extracting regions 22 and 23 are not formed at the corner sections of the piezoelectric plate 2 but are interposed between inclined side wall surfaces on both sides of the thickened portions 6C and 6D. This structural advantage lowers the possibilities of any crack and/or chipping of the piezoelectric vibration piece 1A.

The respective electrodes are formed of, for example, silver by vacuum evaporation.

Similarly to the piezoelectric vibration piece 1 according to the earlier embodiment, the piezoelectric vibration piece 1A according to this embodiment has contact metals 14 and 15 formed of the same material, chromium, in thicknesses between 10 Å and 30 Å on front and back surfaces of the piezoelectric plate 2. For illustrative purposes, the thicknesses of the contact metals 14 and 15 are exaggeratedly drawn in FIG. 10.

As illustrated in FIGS. 8 and 11, end parts 10a and 11a of the extraction electrodes 10 and 11 associated with the common electrode 8 are extracted to the electrode-extracting regions 20 and 21, and the end part 11a is connected to an internal terminal 17b of a package 16 through a conductive adhesive s3 illustrated with a virtual line.

On the other hand, end parts 12a and 13a of the extraction electrodes 12 and 13 associated with the divided electrodes 8 and 9 are extracted to the electrode-extracting regions 22 and 23, and similarly connected to internal terminals 17a and 17c of the package 16 through the conductive adhesive s3 illustrated with a virtual line.

Referring to FIGS. 12a and 12b, functions of the contact metal 14 are described. FIG. 12a is an enlarged plan view of a section pointed by arrow G3 and its vicinity in FIG. 11. FIG. 12b is a sectional view of the illustration of FIG. 12a cut along XIIb-XIIb line. Hereinafter are described functions when the conductive adhesive s3 is applied onto the end part 11a of the extraction electrode 11 extracted to the electrode-extracting region 21, however, functions associated with the other electrode-extracting regions 20, 22, and 23 draw on the functions associated with the electrode extracting region 21. The conductive adhesive s3 is hatched in the drawing.

The end part 11a of the extraction electrode 11 extracted to the electrode-extracting region 21 is connected to the internal terminal 17b through the conductive adhesive s3, which is not illustrated in the drawings.

If the loading and coating area of the conductive adhesive s3 are too large for the electrode-extracting region 21, the conductive adhesive s3 may flow out onto the thinned portion 5. However, by virtue of surface tension acted upon the conductive adhesive s3 by a large number of projections and depressions formed on the electrode-extracting region 21 and side wall surfaces 6A1 and 6B1 of the thickened regions 6A and 6B by multiple metallic thin films 14a constituting the contact metal 14, the conductive adhesive s3 does not flow out toward the thinned portion 5 but stays within the electrode-extracting region 21.

Therefore, the piezoelectric vibration device in which the conductive adhesive s3 has been thermally cured can continuously exert a desired vibration performance.

Figure 13A:
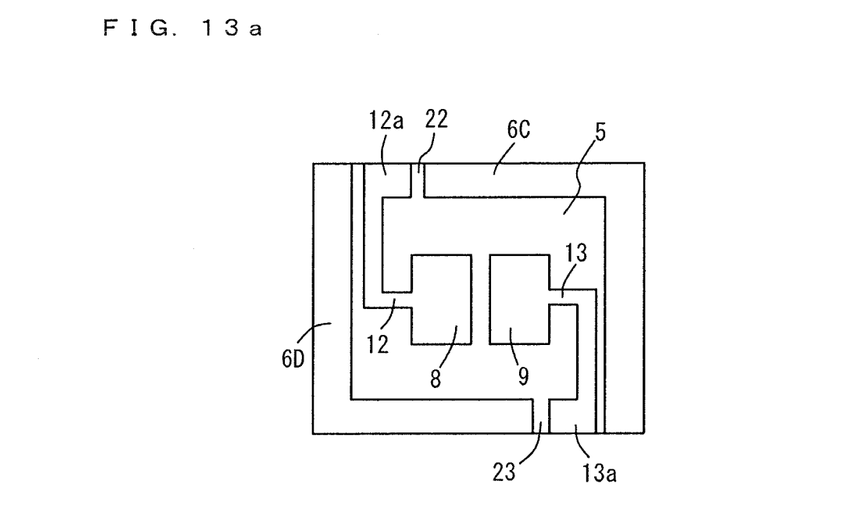
FIG. 13a is a lower view of the piezoelectric vibration piece.
Figure 13B:
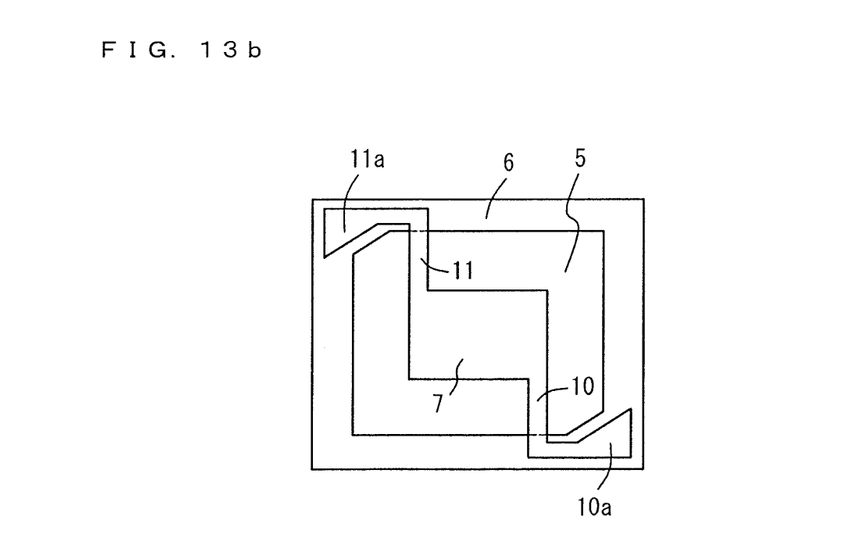
FIG. 13b is an upper view of the piezoelectric vibration piece of FIG. 13a comprising, on its upper surface, a corresponding common electrode.
Figure 13C:
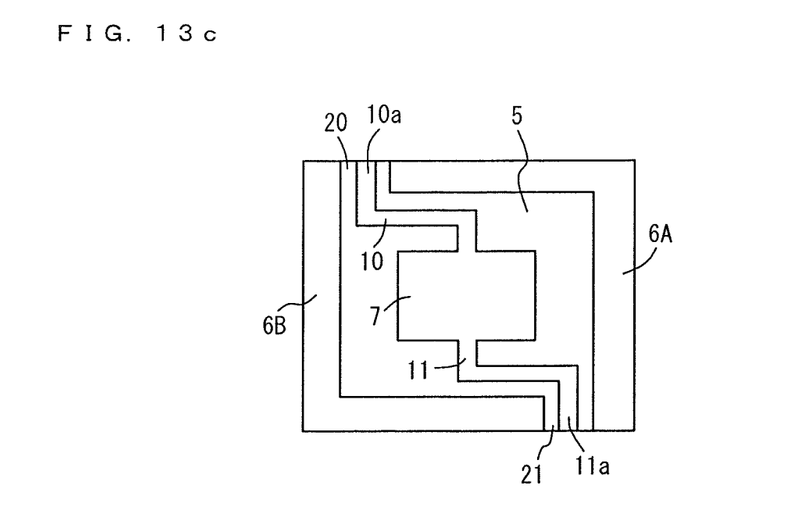
FIG. 13c is an upper view of the piezoelectric vibration piece of FIG. 13a comprising, on its upper surface, another corresponding common electrode.
Figure 13D:
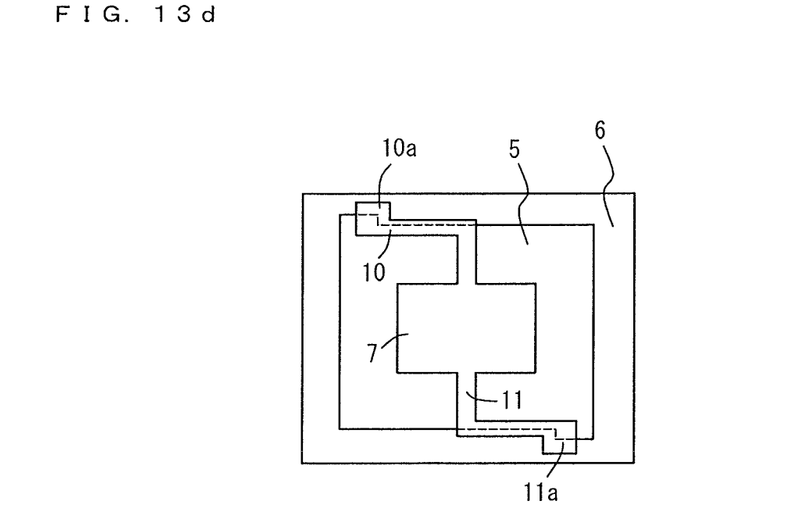
FIG. 13d is an upper view of the piezoelectric vibration piece of FIG. 13a comprising, on its upper surface, yet another corresponding common electrode.

Referring to FIGS. 13a to 13d is described a modified example of the common electrode 7 with respect to the extraction electrodes 12 and 13 associated with the divided electrodes 8 and 9. FIG. 13a is a lower view of the piezoelectric vibration piece, and FIGS. 13b through 13d are upper views of the piezoelectric vibration piece. In FIG. 13a, the end parts 12a and 13a of the extraction electrodes 12 and 13 associated with the divided electrodes 8 and 9 are extracted to the electrode-extracting regions 22 and 23. In FIG. 13b, the thickened portion 6 is provided along the whole perimeter of the thinned portion 5, and the end parts 10a and 11a of the extraction electrodes 10 and 11 associated with the common electrode 7 are extracted as illustrated in this drawing. In FIG. 13c, the end parts 10a and 11a of the extraction electrodes 10 and 11 associated with the common electrode 7 are extracted to the electrode-extracting regions 21 and 22. In FIG. 13d, the thickened portion 6 is provided along the whole perimeter of the thinned portion 5, and the end parts 10a and 11a of the extraction electrodes 10 and 11 associated with the common electrode 7 are extracted as illustrated in this drawing.

As with the piezoelectric vibration piece described earlier, the piezoelectric vibration piece illustrated in FIGS. 13a to 13d has contact metals formed on all over the upper and lower surfaces of the AT-cut crystal piezoelectric plate, wherein the respective electrodes are formed on these contact metals. Therefore, the piezoelectric vibration device comprising the piezoelectric vibration piece incorporated in the package can continuously exert a desired vibration performance.

Figure 14A:
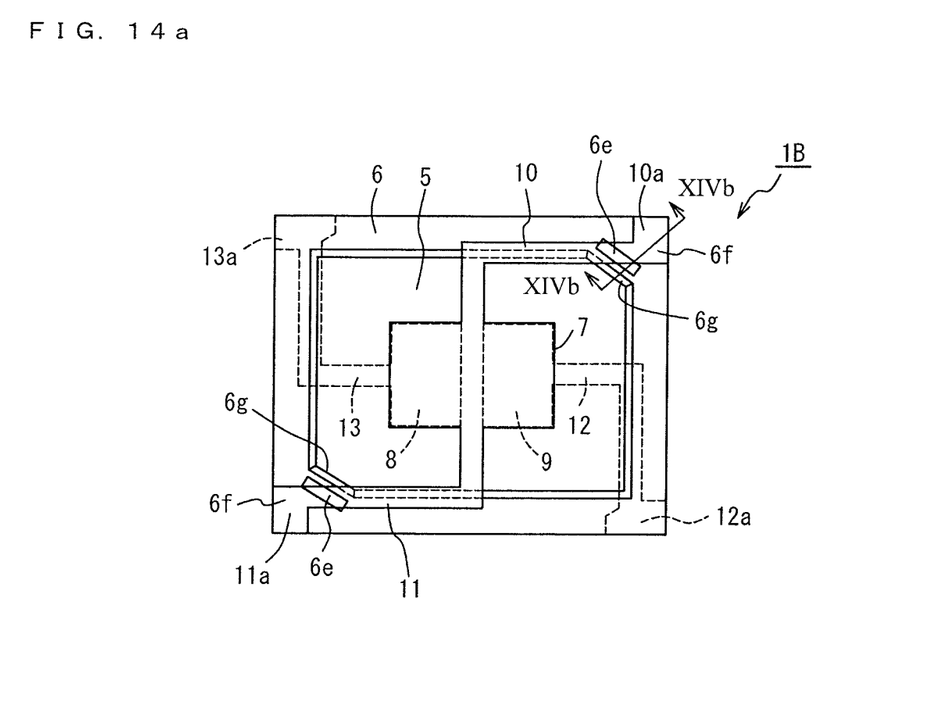
FIG. 14a is an upper view of a piezoelectric vibration piece according to yet another embodiment of the invention.
Figure 14B:
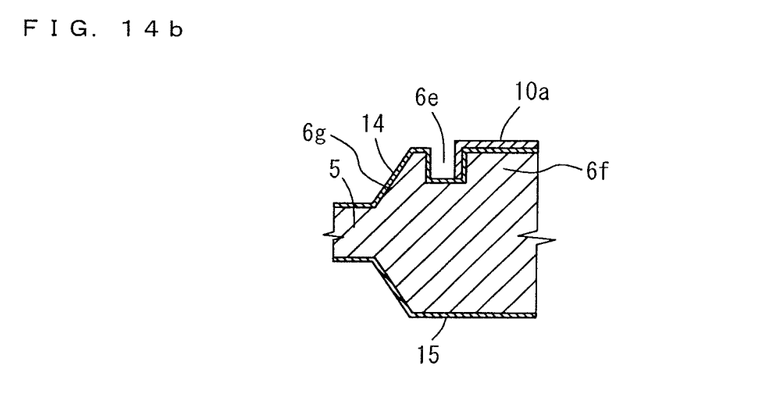
FIG. 14b is a sectional view of the illustration of FIG. 14a cut along XIVb-XIVb line.

A piezoelectric vibration piece according to yet another embodiment of the invention is described referring to FIGS. 14a and 14b. FIG. 14a is an upper view of the piezoelectric vibration piece according to this embodiment. FIG. 14b is a sectional view of the illustration of FIG. 14a cut along XIVb-XIVb line. A piezoelectric vibration piece 1B has recesses 6e formed at a pair of corner sections of a thickened portion 6 diagonally opposite to each other. The thickened portion 6 is in the form of a frame rectangular in planar view. At a pair of corner sections 6f diagonally opposite to each other in the rectangular frame of the thickened portion 6 are provided end parts 10a and 1a of the extraction electrodes 10 and 11 associated with the common electrode 7. The corner sections 6f are each provided with an inclined side wall surface 6g orthogonal to a diagonal line and a recess 6e in parallel to the inclined side wall surface 6g. On the both surfaces of the thickened portion 6 including the recesses 6e are formed contact metals 14 and 15. When a conductive adhesive, not illustrated in the drawings, is applied thereto, the conductive adhesive is filled in the recesses 6e and accordingly connected to the end parts 10a and 11a. The formation of the recesses 6e effectively prevents the conductive adhesive from flowing out of the thickened portion 6 onto the thinned portion 5.

The common electrode 7 is provided on the upper-surface side of the piezoelectric vibration piece 1B according to this embodiment. However, the divided electrodes 8 and 9 may be provided on the upper-surface side, in which case, as described earlier, the recesses 6e are preferably provided at the corner sections of the thickened portion 6 diagonally opposite to each other.

Figure 15:
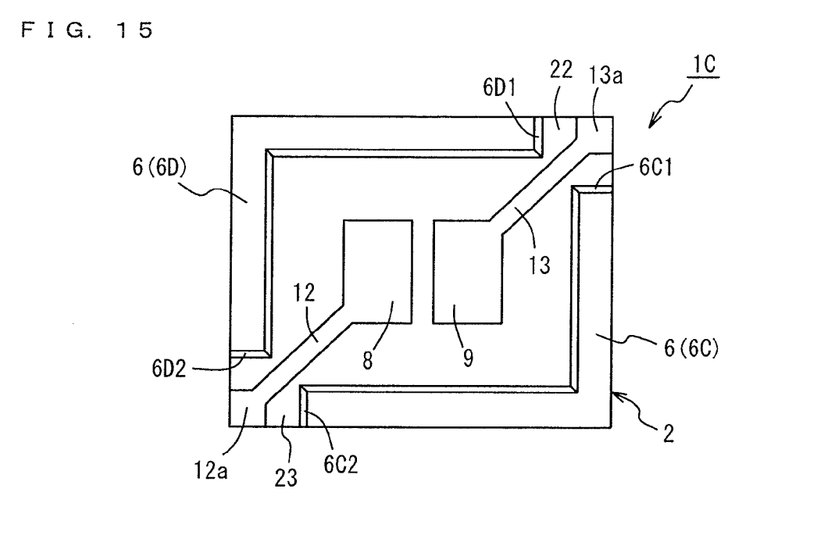
FIG. 15 is a lower view of a piezoelectric vibration piece according to yet another embodiment of the invention.

A piezoelectric vibration piece according to yet another embodiment of the invention is described referring to referring to FIG. 15. FIG. 15 is a lower view of the piezoelectric vibration piece. A piezoelectric vibration piece 1C of this drawing according to the present embodiment is structurally characterized in that, at corner sections diagonally opposite to each other on the lower surface of the piezoelectric plate 2, partial regions of the thickened portion 6 are substantially equal in thickness to the thinned portion 5, constituting electrode-extracting regions 20 and 21. On the lower-surface side of the piezoelectric plate 2, the thickened portion 6 is divided into two thickened regions 6C and 6D with the electrode-extracting regions 20 and 21 interposed therebetween. Further, end parts 12a and 13a of extraction electrodes 12 and 13 associated with divided electrodes 8 and 9 are extracted to corner sections of the piezoelectric plate 2 within the electrode-extracting regions 22 and 23.

The electrode-extracting region 22 is facing both of an inclined side wall surface 6D1 of the thickened portion 6D and an inclined side wall surface 6C1 of the thickened portion 6C. The electrode-extracting region 23 is facing both of an inclined side wall surface 6D2 of the thickened portion 6D and an inclined side wall surface 6C2 of the thickened portion 6C. However, the inclined side wall surface 6D1 of the thickened portion 6D and the inclined side wall surface 6C1 of the thickened portion 6C are not facing each other so as to sandwich the electrode-extracting region 22 from its both sides. Likewise, the inclined side wall surface 6D2 of the thickened portion 6D and the inclined side wall surface 6C2 of the thickened portion 6C are not facing each other so as to sandwich the electrode-extracting region 23 from its both sides. The contact metals including a large number of discrete metallic thin films, not illustrated in the drawing, are respectively formed on the inclined side wall surfaces 6C1, 6D1, 6C2, and 6D2.

According to this embodiment, when a pasty conductive adhesive, not illustrated in the drawing, is applied onto the end parts 12a and 13a of the extraction electrodes 12 and 13 extracted to the electrode-extracting regions 22 and 23, the contact metals formed on the inclined side wall surfaces 6C1, 6D1, 6C2, and 6D2 serve to retain the conductive adhesive within the electrode-extracting regions 22 and 23 not to flow out onto the thinned portion 5.

Figure 16A:
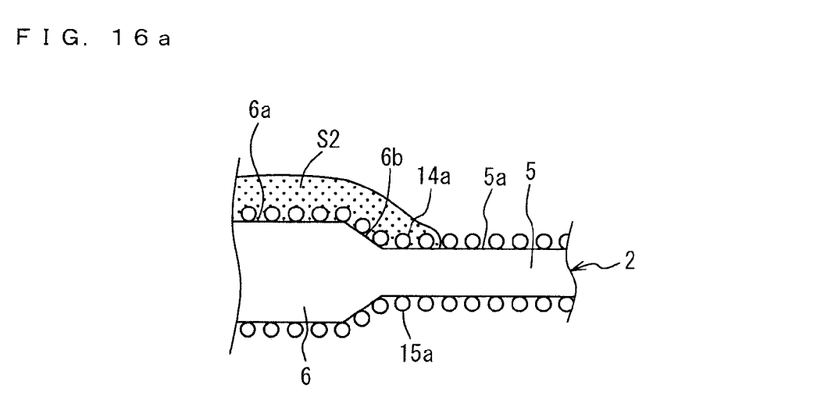
FIG. 16a is a drawing to illustrate an operational advantage of the piezoelectric vibration piece according to the invention.
Figure 16B:
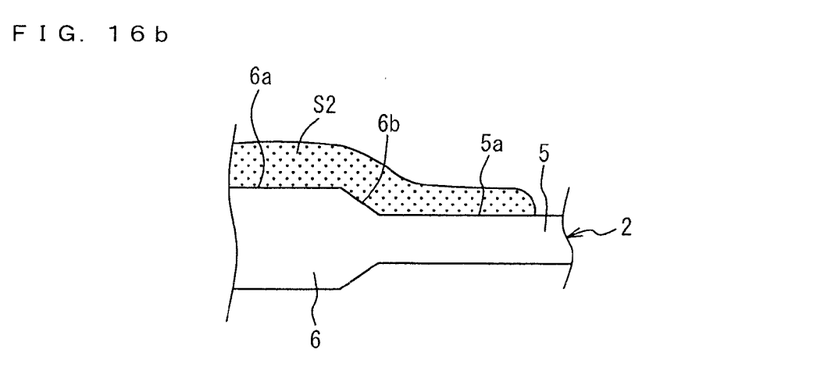
FIG. 16b is a drawing to illustrate an operational advantage of a conventional piezoelectric vibration piece.

According to this embodiment, the conductive adhesive s2 is resting midway on the inclined side wall surface 6b under surface tension acted thereupon by projections and depressions formed by discrete metallic thin films 14a on the inclined side wall surface 6b as illustrated in FIG. 6. Possibly, the conductive adhesive s2, depending on its flow properties, still partly fails to stay on the inclined side wall surface 6b, running down on the inclined side wall surface 6b to finally arrive at an upper surface 5a of the thinned portion 5 as illustrated in FIG. 16a. Yet, this embodiment, in contrast to FIG. 16b illustrating a case not providing the metallic thin films 14a, can prevent the conductive adhesive s2 from advancing inward on the upper surface 5a of the thinned portion 5.

As described thus far, any of the embodiments can stop flowage of the conductive adhesive applied to the extraction electrodes but not yet thermally cured by virtue of surface tension acted upon the conductive adhesive by fine projections and depressions formed by a large number of discrete metallic thin films of the contact metals.

The embodiments of the invention described the piezoelectric filter, wherein the common electrode 7 is formed on the upper surface of the thinned portion 5, and the divided electrodes 8 and 9 are formed on the lower surface thereof. The invention is not necessarily limited thereto but may be applied to vibrators structurally characterized in that a common electrode and a pair of driving electrodes are both formed on upper and lower surfaces of the thinned portion.

The invention is not necessarily limited to the embodiments described thus far. For example, the invention is applicable to crystal vibrators having a circular shape or having different outer dimensions, and crystal vibrators with driving electrodes having different outer dimensions. The invention is further applicable, other than crystal vibrators, to piezoelectric oscillators and piezoelectric filters structurally characterized in that a piezoelectric vibration piece is combined with other circuit elements.

The invention can be carried out in many other forms without departing from its technical concept or principal technical features. The embodiments described so far are just a few examples of the invention in all aspects, which should not be used to restrict the scope of the invention. The scope of the invention is solely defined by the appended claims, and should not be restricted by the text of this description. Any modifications or changes made within the scope of equivalents of the appended claims are all included in the scope of the invention.

The invention claimed is:

1. A piezoelectric vibration piece, comprising:
a piezoelectric plate having a thinned portion serving as a vibration region at a central part thereof, and a thickened portion formed all along or partly along perimeter of the thinned portion to reinforce the thinned portion;
driving electrodes formed on upper and lower surfaces of the thinned portion of the piezoelectric plate; and
extraction electrodes for externally extracting the driving electrodes, wherein
the thickened portion has a first inclined side wall surface facing the thinned portion, and
a contact metal including a large number of discrete metallic thin films is formed on at least the first inclined side wall surface.

2. The piezoelectric vibration piece as claimed in claim 1, wherein
the thickened portion is partly formed in an electrode-extracting region substantially equal in thickness to the thinned portion,
end parts of the extraction electrodes are extracted to the electrode-extracting region,
the thickened portion has, in a part thereof, at least two opposing second inclined side wall surfaces facing the electrode-extracting region, and
the contact metal is provided on not less than one of the at least two opposing second inclined side wall surfaces.

3. The piezoelectric vibration piece as claimed in claim 2, wherein
the contact metal is provided on the at least two opposing second inclined side wall surfaces.

4. The piezoelectric vibration piece as claimed in claim 2, wherein
the contact metal is further provided in the electrode-extracting region.

5. The piezoelectric vibration piece as claimed in claim 1, wherein
the contact metal is made of a metal selected from Cr, Ru, Mo, and W, and
the contact metal has a thickness between 10 Å and 30 Å.

6. The piezoelectric vibration piece as claimed in claim 5, wherein
the contact metal is provided on whole upper and lower surfaces of the piezoelectric plate, and the electrodes are provided on the contact metals.

7. The piezoelectric vibration piece as claimed in claim 1, wherein
the thickened portion is provided on one of or both of the upper and lower surfaces of the thinned portion of the piezoelectric plate.

8. The piezoelectric vibration piece as claimed in claim 1, wherein
the driving electrodes comprise a common electrode provided on one of the surfaces of the piezoelectric plate, and at least a pair of divided electrodes provided correspondingly to the common electrode on another one of the surfaces of the piezoelectric plate.

9. The piezoelectric vibration piece as claimed in claim 1, wherein
the thinned portion is rectangular in planer view, serving as a vibration region,
the thickened portion is formed along perimeter of the thinned portion and having at least a pair of corner sections diagonally opposite to each other,
end parts of a pair of extraction electrodes for extracting the common electrode are formed at the at least a pair of corner sections of the thickened portion, and recesses are formed at the at least a pair of corner sections,
the contact metal is provided in the recesses, and end parts of the pair of extraction electrodes are respectively provided on the contact metals.

10. The piezoelectric vibration piece as claimed in claim 1, wherein
an AT-cut crystal plate constitutes the piezoelectric plate.

11. A piezoelectric vibration device at least comprising the piezoelectric vibration piece as claimed in claim 1, and a package in the form of a shallow box with an open upper surface, the package having internal terminals formed in an inner bottom part thereof, and
the piezoelectric vibration piece is housed in the package, and the extraction electrodes of the piezoelectric vibration piece are connected to the internal terminals through a conductive adhesive.

* * * * *